United States Patent [19]
Enomoto et al.

[11] Patent Number: 5,243,215
[45] Date of Patent: Sep. 7, 1993

[54] SEMICONDUCTOR PHOTODIODE DEVICE WITH REDUCED JUNCTION AREA

[75] Inventors: Yoshinari Enomoto; Yoshio Tsuruta, both of Matsumoto, Japan

[73] Assignee: Fuji Electric Co., Ltd., Kawasaki, Japan

[21] Appl. No.: 704,052

[22] Filed: May 22, 1991

[30] Foreign Application Priority Data

May 31, 1990 [JP] Japan .................. 2-142336
Sep. 20, 1990 [JP] Japan .................. 2-253164

[51] Int. Cl.[5] ............... H01L 27/14; H01L 31/00
[52] U.S. Cl. .................... 257/443; 257/446; 257/461
[58] Field of Search ........... 357/30 H, 30 D, 47, 357/48, 50, 30 P, 30 L, 32; 257/443, 446, 461

[56] References Cited

U.S. PATENT DOCUMENTS 4,450,464  5/1984  Yamada ................. 357/50
4,910,568  3/1990  Takei et al. ............. 357/30 D

FOREIGN PATENT DOCUMENTS 75924    4/1983  European Pat. Off. ...... 357/30 D
35-13196 10/1985  Fed. Rep. of Germany ... 357/30 H
61-141175 6/1986  Japan .................. 357/30 H
2-294078 12/1990  Japan .................. 357/30 D

OTHER PUBLICATIONS

Jacobus, "Photodiode Arrays", IBM Technical Disclosure Bulletin, vol. 13, No. 8, Jan. 1971.

Primary Examiner—Rolf Hille
Assistant Examiner—Minhloan Tran
Attorney, Agent, or Firm—Brumbaugh, Graves, Donohue & Raymond

[57] ABSTRACT

The present invention discloses a light-receiving element, and method for making same, for a charge storage light sensor having a first semiconductor layer of a first conductive type with an element isolation region disposed thereon. The element isolation regions are formed to produce tilted edges embedded within the first semiconductor layer and to also produce an embedded region of a second conductive type. The embedded region is effective to collect the photoelectric current resulting from light exposure to the first semiconductor layer regions upon the application of a reverse bias potential to the embedded region.

2 Claims, 5 Drawing Sheets

SEMICONDUCTOR PHOTODIODE DEVICE WITH REDUCED JUNCTION AREA

FIELD OF THE INVENTION

The present invention relates to a semiconductor device equipped with a photodiode which acts as a light-receiving portion of a charge-storage light sensor, and more particularly to a photodiode sensor with reduced junction capacitance and enhanced sensor sensitivity, and a method of manufacturing thereof.

BACKGROUND OF THE INVENTION

In order to increase the sensitivity of a semiconductor device equipped with a photodiode having a p-n junction, the junction capacitance existing on the junction face of the photodiode must be reduced. Various means have been employed to this end.

First, the relation between the junction capacitance resulting from the photodiode structure and sensitivity will be explained, taking as an example a luminous energy detection circuit in charge-storage light a sensor in which a photodiode is used as a light-receiving part. The conventional luminous energy detection circuits in charge-storage light sensors can be roughly divided into two types. One type has circuitry as shown in FIG. 4(a). These circuits store a charge for a certain period of time and detect the charge amount as a voltage. Circuits of this type are used in solid-image MOS sensors. The other type has circuitry a shown in FIG. 5(a). These circuits measure the amount of time before a certain voltage is reached.

The former type of circuit, shown in FIG. 4(a), operates according to the timing chart shown in FIG. 4(b). First, a transistor 16 is closed and, up until time $t_1$, a junction capacitance in a photodiode 15 is applied with a reverse bias, and a charge is stored. Next, when transistor 16 is opened at time $t_1$ and brought back to a closed state at time $t_2$, a charge is generated in photodiode 15 corresponding to the light energy received during time $T = t_2 - t_1$, and that much of the charge stored in junction capacitance 18 in photodiode 15 is discharged.

When transistor 16 is closed at time $t_2$, a current flows through a load resistance 17 in order to charge the junction capacitance 18 in photodiode 15. An output voltage V shows at this time a maximum value Vo, as shown in FIG. 4(b). In this case, the maximum value Vo is presented in the following equation:

$$V_o = i \cdot T / (C + C_{12}) \quad (1)$$

where i is a photoelectric current corresponding to light energy, $C_1$ is junction capacitance 18 in photodiode 15, and $C_2$ is parasitic capacitance 19 in the circuit.

Next the circuit of the latter type, shown in FIG. 5(a), operates according to the timing chart shown in FIG. 5(b). In this circuit, a comparator output $V_2$ reverses when a potential V is equivalent to a reference voltage $V_{ref}$ in a comparator 20. Measuring this time $t_2$ gives $T = t_2 - t_1$. In this case, T is expressed by the following equation:

$$T = (C_1 + C_2) \cdot V_{ref} / i \quad (2)$$

Thus, by measuring Vo in the former case, and T in the latter case, the photoelectric current i corresponding to the light energy can be obtained, and light energy can be detected. The sensitivity of such a light sensor can be raised by elevating the $V_o$ relative to a given light energy in equation (1), and by shortening the T relative to a given light energy in equation (2).

In both cases, the photoelectric current i relative to a given light energy may be increased, and $C_1 + C_2$ may be decreased. However, there exists a lower limit to the parasitic capacitance $C_2$, which is determined by the detection circuit, and no further reduction beyond this limit is possible. In order to increase the photoelectric current i, the expansion of the light receiving area is the most effective means, but an increase in the light-receiving area conversely reduces the resolution of the light sensor, and is hence undesirable. Therefore, to increase the sensitivity of the light sensor, junction capacitance C in the photodiode must be reduced.

The conventional structure of a photodiode with a p-n junction will now be explained with reference to FIGS. 3 (a) (b) and (c). FIG. 3(a) is a diagram view, and FIG. 3(b) is a cross-section of FIG. 3(a) sectioned along the A—A, line. When using an n-type silicon substrate as a low concentration layer 9 of the first conduction type, for example, an impurity, such as P (phosphorus) is diffused on a non-active region on the surface of the substrate to form a region 8 of the first conduction type, being an n-type high concentration semiconductor to isolate each sensor in which the active regions are used as isolation islands. Furthermore, B (boron) is diffused as an impurity over the active regions to form a region 13 of the second conduction type, being a p-type semiconductor. FIG. 3(c) is an expansion of region 13 of the second conduction type in FIG. 3(b). Region 8 of the first conduction type with high concentration and layers 9 of the first conduction type with low concentration surround the regions 13 of the second conduction type which constitute each sensor. In this case, while regions 8 and 9 are both first conduction type regions, region 8 of the first conduction type is normally set at a high concentration to isolate the sensors, and the layer of the first conduction type is set at a low concentration.

When a photodiode is applied with a reverse bias, depletion regions 14 are formed around the junction faces. In conventional photodiodes, regions 13 of the second conduction type occupy the entirety of the light receiving parts, except for the regions used for isolation, whereas the photodiode utilizes a p-n junction among region 13 of the second conduction type and regions 8 and 9 of the first conduction type.

Therefore, in conventional photodiodes, the junction capacitance $C_1$ is proportional to this p-n junction area and interrelated with the area of light-receiving part.

As a means to reduce $C_1$, another structure has been proposed as shown in FIG. 6. This structure forms a region 21 of the second conduction type in a ring-shape to reduce the p-n junction area and hence to reduce $C_1$.

However, this structure has dimensional limitations, rendering it extremely difficult to make the width d less than 1 μm. Also, to form region 21 of the second conduction type, a masking process and a process to introduce impurities are required, as in the conventional structure shown in FIG. 3.

An increase in the sensitivity of a light sensor requires the reduction of junction capacitance $C_1$ in a photodiode. However, in conventional photodiodes, a reduction of the junction area to decrease the junction capacitance $C_1$ results in a reduced light-receiving area, which ultimately reduces the photoelectric current i. Thus no improvement in the sensitivity of a light sensor can be expected.

Arranging the regions of the second conduction type in a ring-shape also produces a limited reduction of the p-n junction area, and the number of associated manufacturing processes could be more than if a ring shape is not used, but can never be less.

SUMMARY OF THE INVENTION

The present invention was designed to solve the above problems and to provide a semiconductor device equipped with a photodiode with a reduced junction capacitance $C_1$ without reducing the photoelectric current i, and with a more sensitive light sensor, by means of structuring the photodiode with a junction area much smaller than the light receiving area, and by means of a simplified method for manufacturing the semiconductor device.

The present invention solves the above problems in a semiconductor device equipped with a photodiode having a p-n junction between a first conduction type region and a second conduction type region formed adjacent to lower tilted parts of the edges of local oxide films for element isolation in the first conduction type region.

A manufacturing method for a semiconductor device structured as above includes a process for masking regions other than those predetermined to form the local oxide films for element isolation on the surface of the layer of the first conduction type, a process for ion-implanting an impurity of the second conduction type in the predetermined formation region, and a heat-treatment process for forming the local oxide films for element isolation.

In the process of ion-implanting the impurity into the surface of the layer of the first conduction type, the implanting should be performed at an average concentration of more then 200 times and less than 500 times the concentration of the impurity in the layer of the first conduction type.

According to the above means, because the region of the second conduction type formed adjacent to the lower tilted parts of the edges of local oxide films for element isolation n the region of the first conduction type is at a low concentration and is very small in size, the area of the p-n junction consisting of the region of the second conduction type and the region of the first conduction type is minimal. In addition, the size of the region of the second conduction type is small because the region of the lower second conduction type is formed adjacent to the lower tilted parts of the edges of local oxide films for element isolation in the region of the first conduction type, but does not reduce the light-receiving area because the layer of the first conduction type forms the light-receiving part. Therefore, the ratio of the junction area to the light-receiving area can be made smaller, thereby reducing the junction capacitance without reducing the photoelectric current i, and making it possible to manufacture a photodiode with a more sensitive light sensor.

In the semiconductor device equipped with a photodiode according to the present invention, the carrier generated by the light radiated into the depletion region in the p-n junction face in a reverse bias state turns into a photoelectric current at nearly 100% because there is a high electric field in the depletion region, while the carrier generated in the regions other than the depletion region turns into a photoelectric current due to diffusion. Therefore, in the above photodiode structure, its photoelectric current conversion efficiency decreases because the depletion area is less than that in conventional photodiode structures. However, since the diffusion length of the carrier is normally retained at more than 500 $\mu$m in the layer region of the first conduction type of a low concentration (with an impurity concentration of approximately $1\times10^{15}/cm^3$), a sufficient amount of photoelectric current can flow due to diffusion if the size of the light sensor is approximately 100 $\mu$m. Hence, the photoelectric current does not decrease noticeably. Therefore, because the junction capacitance has been reduced, the sensitivity of the light sensor can be enhanced in a semiconductor device equipped with a photodiode according to the present invention.

Furthermore, when the region of the second conduction type is formed in a ring shape along the silicon oxide films for element isolation, the carrier generated in the layer of the first conduction type with a low concentration diffuses into other regions, thus preventing leaks.

Furthermore, in regions of each conduction type in conventional photodiodes, the region of the second conduction type is formed entirely over the light-receiving part, and the p-n junction face is formed on the interface with the region of the first conduction type in the lower part of the region of the second conduction type, which restricts the sufficient reduction of the junction area and increases the number of required manufacturing processes. However, since the method of manufacturing the semiconductor device equipped with a photodiode according to the present invention includes a process for masking regions other than those regions predetermined to form local oxide films for element isolation on the surface of the layer of the first conduction type, a process for ion-implanting an impurity of the second conduction type in the predetermined formation region, and the heat-treatment process for forming the local oxide films for element isolation, a semiconductor device equipped with a photodiode with a greatly reduced junction capacitance and fewer manufacturing processes can be manufactured according to the present invention as follows.

First, an impurity of the second conduction type is ion-implanted only into the regions predetermined to form the local oxide films for element isolation, and the local oxide films for element isolation are formed on the regions by means of heat oxidation. The impurity of the second conduction type diffuses at this time in a great quantity into the local oxides, and the area directly below the local oxide films form the region of the first conduction type However, because the edges of the local oxide films extend laterally with inclination, the diffusion of the impurity of the second conduction type is suppressed at the edges with thinner films. Therefore, even upon completion of the information of the local oxide films and completion of the area directly below the local oxide films turning to the region of the first conduction type, the impurity of the second conduction type remains in the lower tilted parts of the edges of the local oxide films, forming very small regions of the second conduction type with low concentration.

Thus, according to the manufacturing method of the present invention, very small regions of the second conduction type can be formed in the lower tilted parts of the local oxide film within the region of the first conduction type.

Also according to the present invention, the masking process, the ion injection process, and the process for forming local oxide films for element isolation used in forming regions of each conduction type can be implemented using the same process for forming other element isolating regions in the semiconductor device. Hence n additional processes are required. Therefore, this manufacturing method requires no special techniques to create finer structures.

BRIEF DESCRIPTION OF THE DRAWINGS

The invention will be described with respect to specific embodiments thereof. Reference will be made to the drawings, in which like portions are given like designations, and in which.

DETAILED DESCRIPTION

FIG. 1 shows an embodiment of the present invention for a light sensor array structure using a photodiode designed according to the present invention. FIG. 2 shows cross-sections of the photodiode according to the present invention in each manufacturing process.

Figure 1A:
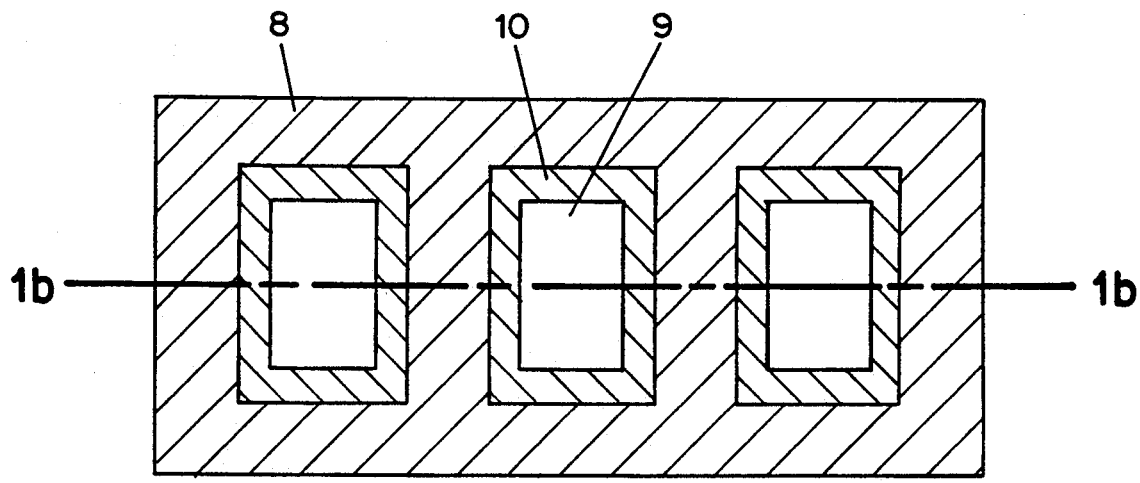
FIG. 1(a) is a diagram view of the photodiode according to one embodiment of the present invention.
Figure 1B:
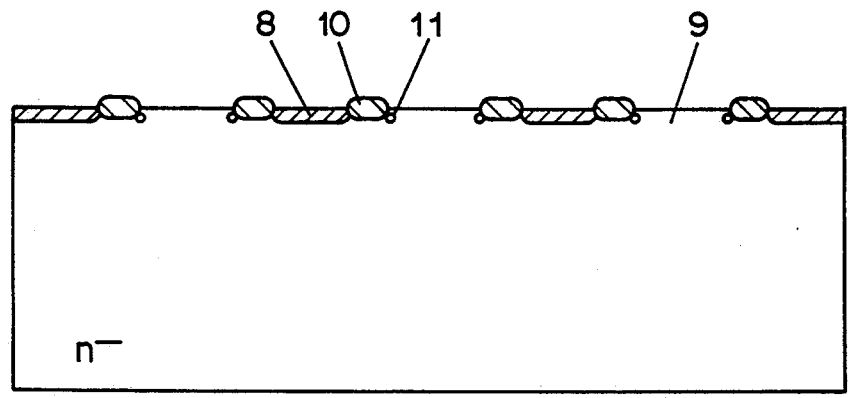
FIG. 1(b) is a cross-section of FIG. 1(a) sectioned along the A—A line.
Figure 1C:
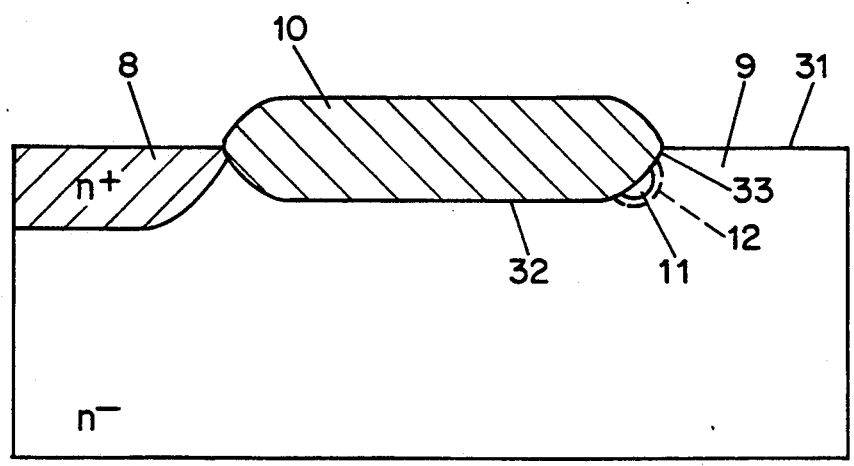
FIG. 1(c) is an expanded view of the region 11 of the second conduction type of low concentration in FIG. 1(b)

FIG. 1(a) is a diagram view of the light sensor array structure using a photodiode designed according to the present invention. FIG. 1(b) is a cross-section of FIG. 1(a) sectioned along the A—A' line, and FIG. 1(c) is an expanded view of a region 11 of the second conduction type of low concentration. The number 8 indicates a region of the first conduction type of high concentration; 9, a layer of the first conduction type of low concentration; 10, a silicon oxide film for element isolation; 11, a region of the second conduction type of low concentration; and 12, a depletion layer region generated when the photodiode is applied with a reverse bias. Layer 9 of the first conduction type of low concentration is an n-type silicon substrate, having stepped, substantially flat first and second portions 31 and 32, and a connecting portion 33. After a p-type impurity is ion-implanted into a region predetermined to form silicon oxide film for element isolation to be used as an isolation island, silicon oxide film for element isolation is formed by means of heat oxidation. In the embodiment shown in FIG. 1, the very small regions ii of the second conduction type of low concentration have horizontal width less than 0.5 μm and are formed in a ring-shape at the lower tilted parts of the edges of the silicon oxide films for element isolation alon silicon oxide film 10 for element isolation. Consecutively, an n-type impurity of high concentration is diffused to form the region 8 of the first conduction type of high concentration.

Figure 3A:
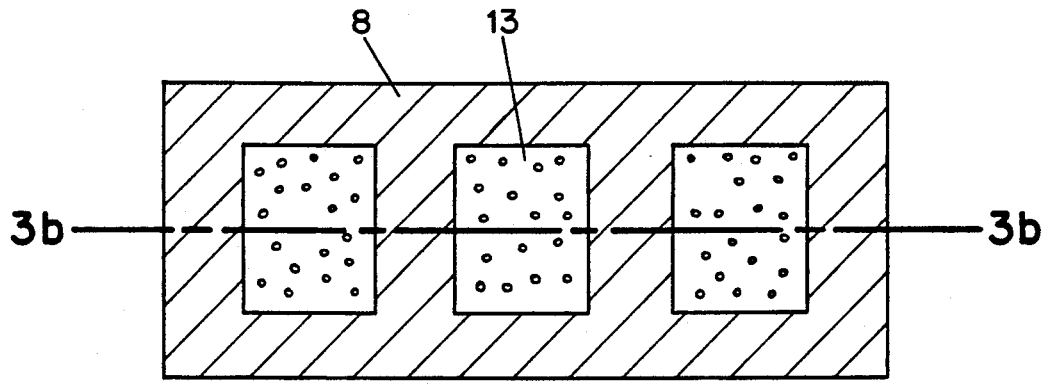
FIG. 3(a) is a diagram view of the structure of a conventional photodiode.
Figure 3B:
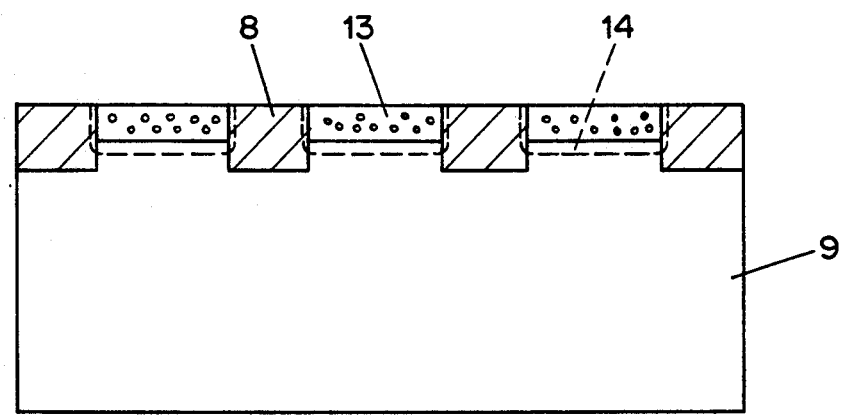
FIG. 3(b) is a cross-section of FIG. 3(a) sectioned along the A—A' line, and FIG. (c) is an expanded view of a region 13 of the second conduction type of low concentration in FIG. 3(b)

In this embodiment, since the junction capacitance is proportional to the junction area between region 11 of the second conduction type of low concentration and the layer 9 of the first conduction type of low concentration, the junction capacitance is decreased by as much as the area is reduced, as compared to the junction area of region 13 of the second conduction type with layer 9 of the first conduction type of low concentration and region 8 of the first conduction type of high concentration in conventional photodiodes, as shown in FIG. 3

In addition, because region 11 of the second conduction type of low concentration is formed adjacent to the lower tilted parts of the edges of silicon oxide film 10 for element isolation within layer 9 of the first conduction type of low concentration, the light-receiving area does not decrease even if the size of the first conduction type of low concentration forms the light-receiving part. Thus, the semiconductor device equipped with a photodiode as described in this embodiment improves the sensitivity of the light sensor. Furthermore, because region 11 of the second conduction type of low concentration is shaped in a ring-shape along silicon oxide films 10 for element isolation, the carrier generated in layer 9 of the first conduction type of low concentration diffuses into other regions, thus preventing leaks.

Figure 2A:
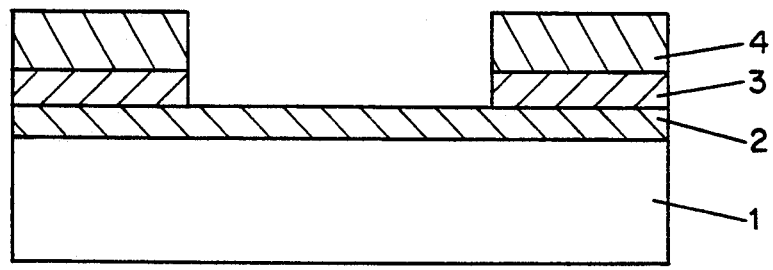
FIGS. 2(a) through 2(d) show cross-sections of the photodiode according to the invention in each manufacturing process.
Figure 2B:
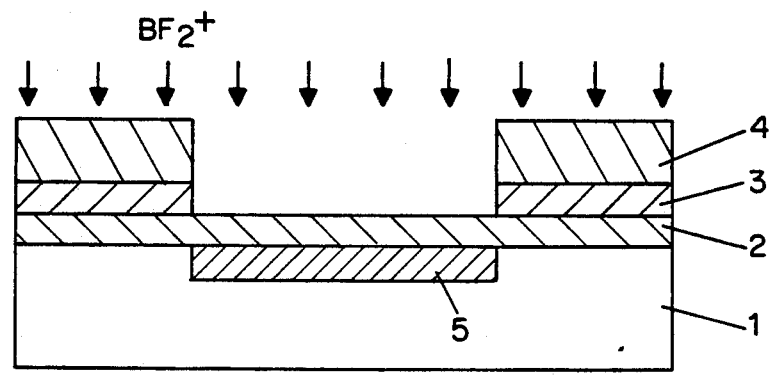

Next, FIGS. 2(a) through (d) will be explained. The number 1 indicates an n-type silicon substrate; 2, a thermal oxide film; 3, a silicon nitride film; 4, a photoresist; 5, an ion-implanted layer; 6, a silicon oxide film for element isolation; 7, a p-type region at low concentration; and 12, a depletion layer region generated when the photodiode is applied with a reverse bias. As shown in FIG. 2(a), a thermal oxide film 2 with a thickness of 400 Å is formed on an n-type silicon substrate 1 with a phospholic concentration of $2 \times 10^{15}/cm^3$, and further thereon a silicon nitride film 3 having a thickness of 1000 Å, using a CVD process. The thermal oxide film 2 is formed as a pad oxide film in order to relieve the stress in the silicon nitride film 3 and the n-type silicon substrate 1 created in forming the silicon nitride film in the subsequent process. Using a publicly known photo-etching technique, silicon nitride film 3 is removed only from the region predetermined for forming the silicon oxide film for element isolation, and a photoresist 4 used for photo-etching is left remaining. Next, ions are implanted through thermal oxide film 2 when the ion-implanting for element isolation is performed under a condition with, for example, $BF_2+$ at $1 \times 10^{13}/cm^2$, 70 KeV, as shown in FIG. 2(b), and an ion-implanted layer 5 with an average concentration of $8'10^{17}/cm^3$ is formed. This boron concentration is 400 times the phosphoric concentration of n-type silicon substrate 1.

Figure 2C:
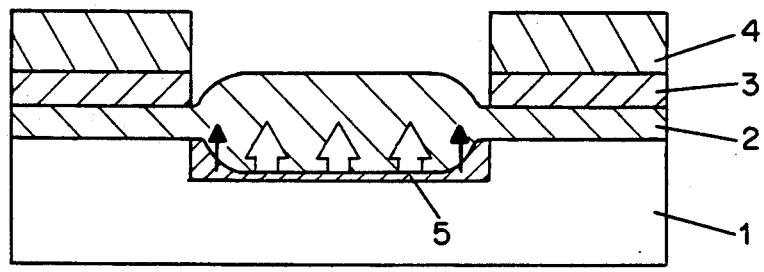
Figure 2D:
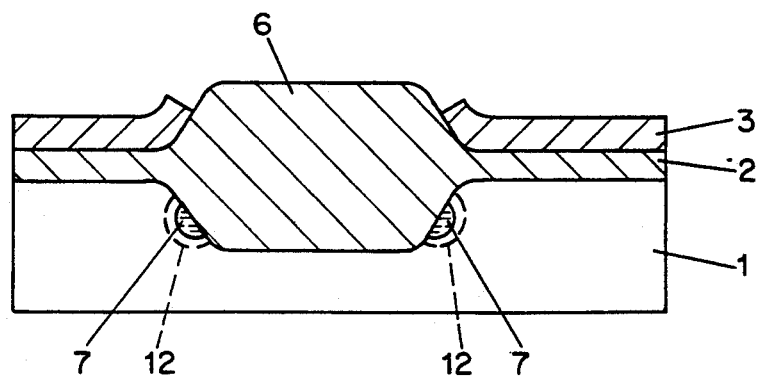

When a thermal oxidation is given under this condition, and a silicon oxide film 6 for element isolation having a thickness of 8600 Å is formed, as shown in FIGS. 2(c) and (d), the boron that had been ion-implanted diffuses in a great quantity into silicon oxide film 6 for element isolation, and turns to n-type. However, because the silicon oxide film for element isolation extends laterally, the edges of silicon oxide film 6 begin to incline. Since these inclined edges have a smaller film thickness, the diffusion of the boron into the silicon oxide film for element isolation is suppressed and the boron remains in the region where the lower tilted parts of the edges of silicon oxide film 6 for element isolation are bounded by n-type silicon substrate 1 upon completion of the process for forming silicon oxide film 6 for element isolation, ultimately forming a very small p-type region 7 of low concentration and bounding the lower tilted part of silicon oxide film 6 for element isolation. Since the width of the p-type region at low concentration in the horizontal direction is less than 0.5 μm, depletion region 12 will be very small when created on the face of the p-n junction formed by p-type region 7 of low concentration and the n-type silicon substrate 1.

Also according to the present invention, the masking process for forming the regions of each conduction type, the ion injection process, and the process for forming the local oxide films for element isolation used for forming regions of each conduction type can be implemented according to the same process used to form other element isolating regions in the semiconductor device. Hence no additional processes are required. Also, when forming a region of the conduction type having a concentration different from the other elements on one substrate, as in region 11 of the second conduction type of low concentration in the ring-shaped structure, shown in FIG. 1, an ion-implanting process using a higher concentration than employed in the CMOS manufacturing process can concurrently be used because of its capability of being formed by an ion-implanting process using a higher concentration and by a process for forming the silicon oxide film for element isolation, thus requiring no additional processes. Further, the width of the p-type region of low concentration is so small (less than 0.5 μm) that it would require high-level technology were it to be formed by a photolithographic process. Its practical production still remains difficult at present.

As described above, the present invention is characterized in that a region of the first conduction type and a region of the second conduction type formed adjacent to the lower tilted parts of the edges of local oxide films for element isolation in the region of the first conduction type form a p-n junction. Hence it has the following effect.

(1) Because the area of the p-n junction is constituted by the region of the second conduction type of low concentration formed adjacent to the lower tiled parts of the edges of local oxide films for element isolation in the region of the first conduction type, because the region of the first conduction type is extremely small, and because the region of the first conduction type acts directly as a light-receiving part, the light-receiving area will not decrease, thereby making it possible to reduce only the junction capacitance without reducing the photoelectric current. For this reason, the sensitivity of a light sensor in the semiconductor device equipped with a photodiode can be improved.

(2) Because the region of the second conduction type formed ring-shaped along the local oxide film for element isolation surrounds the region of the first conduction type as a light-receiving part, the carrier generated by the radiated light within the region of the first conduction type diffuses into other regions, thus preventing leakage.

(3) Also, according to the manufacturing method of the present invention, because the ion-implanted impurity of the second conduction type diffuses while the local oxide film is formed, and the impurity of the second conduction type that remains during the diffusion forms a very small region of the second conduction type, a semiconductor device equipped with a high-sensitivity photodiode can be manufactured without requiring high-level technology to produce a finer structure.

(4) While the masking process, ion-implanting process, and a process to form the local oxide film for element isolation are used, these processes can be implemented simultaneously and in parallel in the same ways that other element isolating regions are formed on one substrate. Also, when forming a region of the conduction type having a concentration different from that of other elements on one substrate (as in the region of the second conduction type of low concentration), an ion-implanting process using a higher concentration than employed in the CMOS manufacturing process can be used concurrently because of its capability of being formed by an ion-implanting process using a higher concentration and a process for forming silicon oxide film for element isolation, thus requiring no additional processes.

I claim:

1. A semiconductor device having a light receiving element for detecting light in a charge-storage light sensor, said light receiving element comprising:
   a first semiconductor layer of a first conductive type having a first surface;
   an element isolation region at said first surface of said first semiconductor layer, said element isolation region having a tilted edge facing said first surface of said first semiconductor layer; and
   an embedded region of a second conductive type embedded between said first surface of said first semiconductor layer and said tilted edge of said element isolation region;
   wherein, under reverse bias of a junction interface, a depletion region adjacent to said embedded region is effective for carrying a photoelectric current in said charge-storage light sensor, and
   wherein said element isolation region is formed in a ring-shape structure surrounding said first semiconductor layer of said first conductive type.

2. A semiconductor device having a light receiving element for detecting light in a charge-storage light sensor, said light receiving element comprising:
   a first semiconductor layer (9) of a first conductive type having a first surface comprising stepped, substantially flat first and second portions (31 and 32), and a connecting portion (33) between said first and second portions (31 and 32);
   an element isolation region (10) in direct contact with said second portion (32) and said connecting portion (33); and
   an embedded region (11) of a second conductive type, embedded between said connecting portion (33) and said element isolation region (10);
   wherein, under reverse bias of a junction interface, a depletion region (12) adjacent to said embedded region (11) is effective for carrying a photoelectric current in said charge-storage light sensor.

* * * * *

UNITED STATES PATENT AND TRADEMARK OFFICE
CERTIFICATE OF CORRECTION

PATENT NO. : 5,243,215

DATED : September 7, 1993

INVENTOR(S) : Enomoto et al.

Figure 3C:
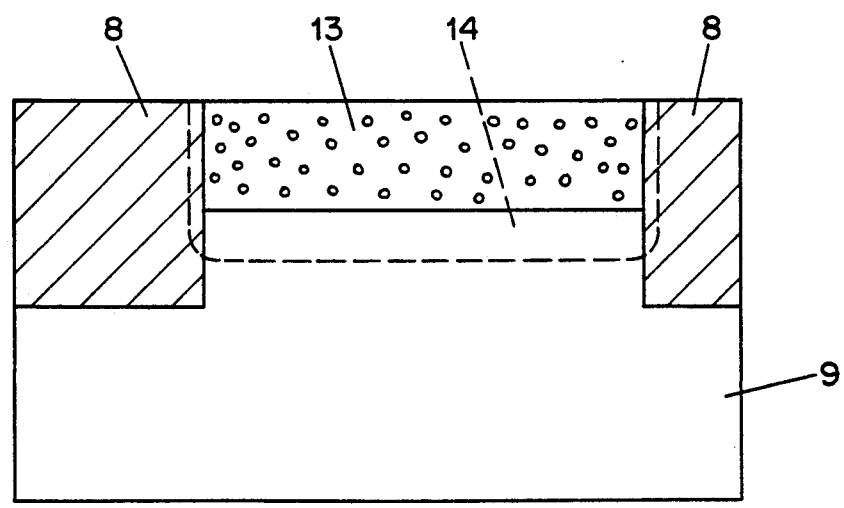
Figure 4A:
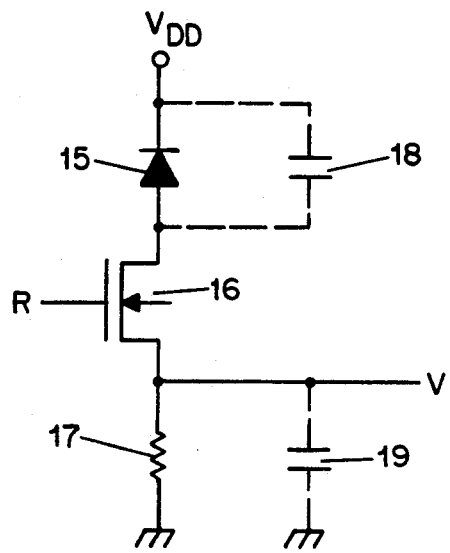
FIG. 4(a) is a circuit diagram illustrating one example of a light energy detection circuit in a charge-storage light sensor and FIG. 4(b) is a timing chart for the circuit.
Figure 4B:
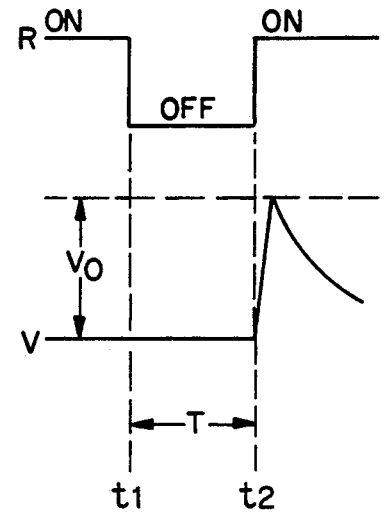
Figure 5A:
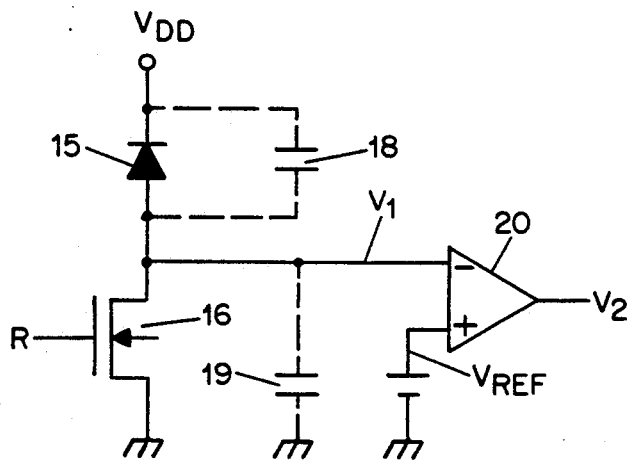
FIG. 5(a) is a circuit diagram illustrating another example of a light energy detection circuit in a charge-storage light sensor.
Figure 5B:
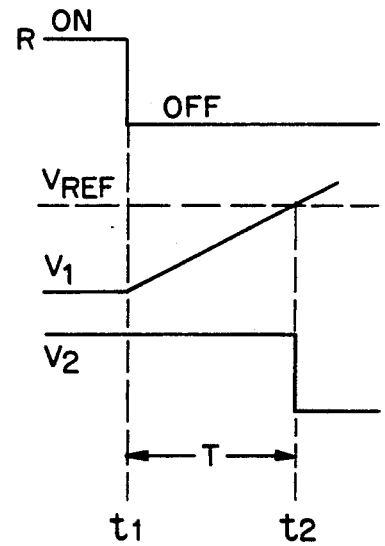
FIG. 5(b) is a timing chart for the circuit.
Figure 6A:
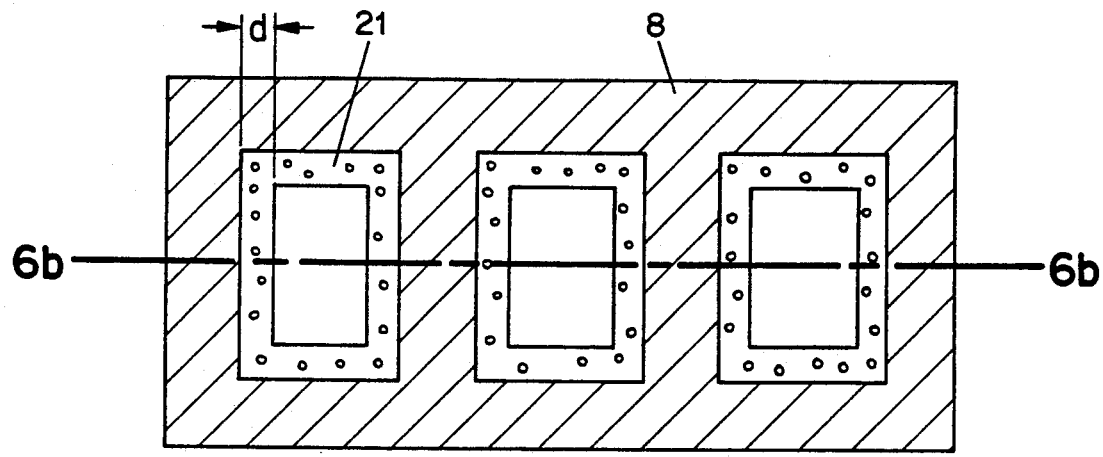
FIG. 6(a) is a diagram view of the structure of another conventional photodiode.
Figure 6B:
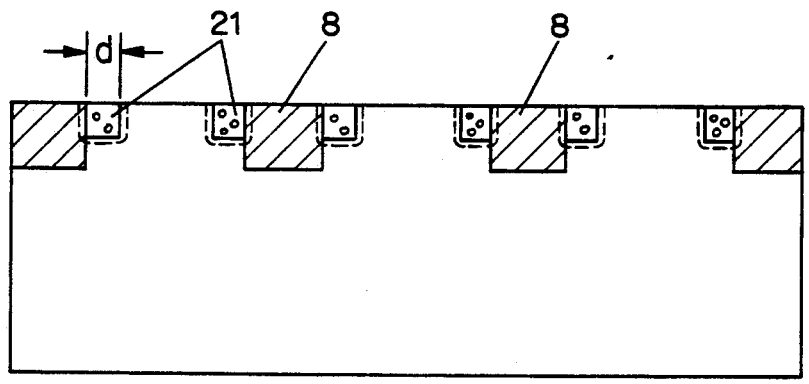
FIG. 6(b) is a cross-section of FIG. 6(a) sectioned along the A—A' line.
Figure 6C:
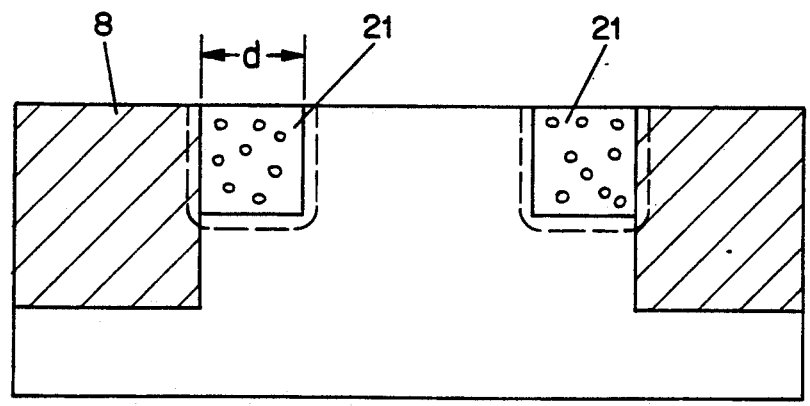
FIG. 6(c) is an expanded view of a region 21 of the second conduction type of low concentration in FIG. 6(b).

It is certified that error appears in the above-identified patent and that said Letters Patent is hereby corrected as shown below:

Column 1, bridging lines 22-23, "charge-storage light a sensor" should read --a charge-storage light sensor--;

Column 1, line 51, that portion of the equation reading "(C + $C_{12}$)" should read --($C_1$ + $C_2$)--;

Column 1, line 59, "V" should read --$V_1$--;

Column 2, line 16, "C" should read --$C_1$--;

Column 2, line 21, "A-A," should read --A-A'--;

Column 5, line 7, "Hence n" should read --Hence no--;

Column 5, line 19, "A-A" should read --A-A'--;

Column 5, line 27, "FIG. (c)" should read --FIG. 3(c)--;

Column 6, line 1, "film" should read --film 10--;

Column 6, line 3, "regions ii" should read --regions 11--;

UNITED STATES PATENT AND TRADEMARK OFFICE
CERTIFICATE OF CORRECTION

PATENT NO. : 5,243,215
DATED : September 7, 1993
INVENTOR(S) : Enomoto et al.

It is certified that error appears in the above-indentified patent and that said Letters Patent is hereby corrected as shown below:

Column 6, line 7, "alon" should read --along--.

Signed and Sealed this

Fifth Day of July, 1994

Attest:

BRUCE LEHMAN

Attesting Officer

Commissioner of Patents and Trademarks